United States Patent [19]
Ishibashi et al.

[11] Patent Number: 5,506,855
[45] Date of Patent: Apr. 9, 1996

[54] SEMICONDUCTOR LASER

[75] Inventors: Akira Ishibashi, Kanagawa; Shoji Kanamaru, Chiba; Hiroyuki Okuyama, Kanagawa; Shunji Imanaga, Kanagawa, all of Japan

[73] Assignee: Sony Corporation, Tokyo, Japan

[21] Appl. No.: 338,087

[22] Filed: Nov. 9, 1994

[30] Foreign Application Priority Data

Nov. 16, 1993 [JP] Japan ................ 5-309848

[51] Int. Cl.⁶ .................................... H01S 3/18
[52] U.S. Cl. .................................... 372/45; 372/43
[58] Field of Search .................................... 372/43, 45, 46

[56] References Cited

U.S. PATENT DOCUMENTS 5,363,395  11/1994  Gaines et al. ................ 372/45
5,377,214  12/1994  Ahn ................ 372/45

Primary Examiner—Rodney B. Bovernick
Assistant Examiner—Jisun Song
Attorney, Agent, or Firm—Hill, Steadman & Simpson

[57] ABSTRACT

A semiconductor laser using II–VI compound semiconductors and capable of emitting blue to ultraviolet light is disclosed. The semiconductor laser is configured to sandwich an active layer made of a $Zn_xMg_{1-x}S_ySe_{1-y}$ compound semiconductor where $0 \leq x < 1$ and $0 \leq y \leq 1$ excluding ranges of $1.2y-2.2x \geq 1$, $1.3y-3.9x \geq 1$, $x \geq 0$, and $y \leq 1$ by an n-type cladding layer and a p-type cladding layer from opposite sides.

4 Claims, 6 Drawing Sheets

1

SEMICONDUCTOR LASER

BACKGROUND OF THE INVENTION

This invention relates to a semiconductor laser and, in particular, to a semiconductor laser using II–VI compound semiconductors and capable of emitting light with a short wavelength.

Demand for semiconductor lasers capable of emitting light with a short wavelength has increased more and more to improve recording densities of optical disks and resolutions of laser printers, and efforts are being made to realize such semiconductor lasers.

Hopeful materials of semiconductor lasers for emitting light with a short wavelength include II–VI compound semiconductors. For example, efforts are directed to semiconductor lasers using ZnSe or ZnSSe as the material of cladding layers and using ZnCdSe or ZnSe as the material of active layers for emitting light with a wavelength less than 600 nm.

However, with no acceptable active layers found, it has been difficult to realize semiconductor lasers for emitting blue to ultraviolet light.

OBJECTS AND SUMMARY OF THE INVENTION

It is, therefore, an object of the invention to provide a semiconductor laser capable of emitting blue to ultraviolet light.

According to an aspect of the invention, there is provided a semiconductor laser configured to sandwich an active layer by an n-type cladding layer and a p-type cladding layer from opposite sides, in which the active layer is made of a $Zn_xMg_{1-x}S_ySe_{1-y}$ compound semiconductor where $0 \leq x < 1$ and $0 \leq y \leq 1$ excluding ranges of $1.2y-2.2x \geq 1$, $1.3y-3.9x \geq 1$, $x \geq 0$, and $y \leq 1$.

The band gap of the $Zn_xMg_{1-x}S_ySe_{1-y}$ compound semiconductor having the above-mentioned composition ranges from 2.7 eV to 4.6 eV at the absolute zero (0 K).

In the semiconductor laser according to the invention, the substrate is preferably made of a material in lattice matching with the $Zn_xMg_{1-x}S_ySe_{1-y}$ compound semiconductor of the active layer, chosen from semiconductor materials having zincblende crystal structures and having lattice constants in the range from the lattice constant of ZnS with a zincblende crystal structure to the lattice constant of MgSe with a zincblende crystal structure. Examples of such materials include a GaAs substrate.

With the semiconductor laser according to the invention, because of using the active layer made of a $Zn_xMg_{1-x}S_ySe_{1-y}$ compound semiconductor (where $0 \leq x < 1$ and $0 \leq y \leq 1$ excluding ranges of $1.2y-2.2x \geq 1$, $1.3y-3.9x \geq 1$, $x \geq 0$, and $y \leq 1$), a semiconductor laser capable of emitting light with a wavelength corresponding to the band gap of 2.7 eV to 4.6 eV of the $Zn_xMg_{1-x}S_ySe_{1-y}$ compound semiconductor at the absolute zero, that is, light of a blue to ultraviolet spectrum.

The above, and other, objects, features and advantage of the present invention will become readily apparent from the following detailed description thereof which is to be read in connection with the accompanying drawings.

DESCRIPTION OF THE PREFERRED EMBODIMENTS

An embodiment of the invention will be described below with reference to the drawings.

For using a $Zn_xMg_{1-x}S_ySe_{1-y}$ compound semiconductor (where $0 \leq x < 1$ and $0 \leq y \leq 1$) as the material of the active layer of a semiconductor laser, a knowledge is indispensable on lattice constants and band gaps of ZnSe, ZnS, MgS and MgSe which are four compound semiconductors with extreme composition ratios of x and y in $Zn_xMg_{1-x}S_ySe_{1-y}$. In this respect, reports were made on lattice constants of MgS and MgSe with rock-salt crystal structures and the band gap of MgS with a rock-salt crystal structure (Phys. Rev. B., 43(1991)2213 and Phys. Rev. B., 43(1991)9228); however, no calculation has been reported on lattice constants and band gaps of MgS and MgSe having zincblende crystal structures.

The present Inventor thus calculated lattice constants and band gaps of MgS and MgSe with zincblende crystal structures, using a method called norm-conserving (first principle) pseudo-potential plane-wave calculation. Although the calculation is not described in detail in this text, it used unit cells each including two atoms and used about 1600 plane waves per each of ten independent wave number vectors.

First calculation was made for most stable lattice constants of MgS and MgSe with zincblende crystal structures to minimize their total energies, and resulted in 5.48 Å and 5.82 Å, respectively, at 0 K. Predicted lattice constants of MgS and MgSe with zincblende crystal structures at 77 K are 5.62 Å and 5.89 Å, respectively.

Figure 1:
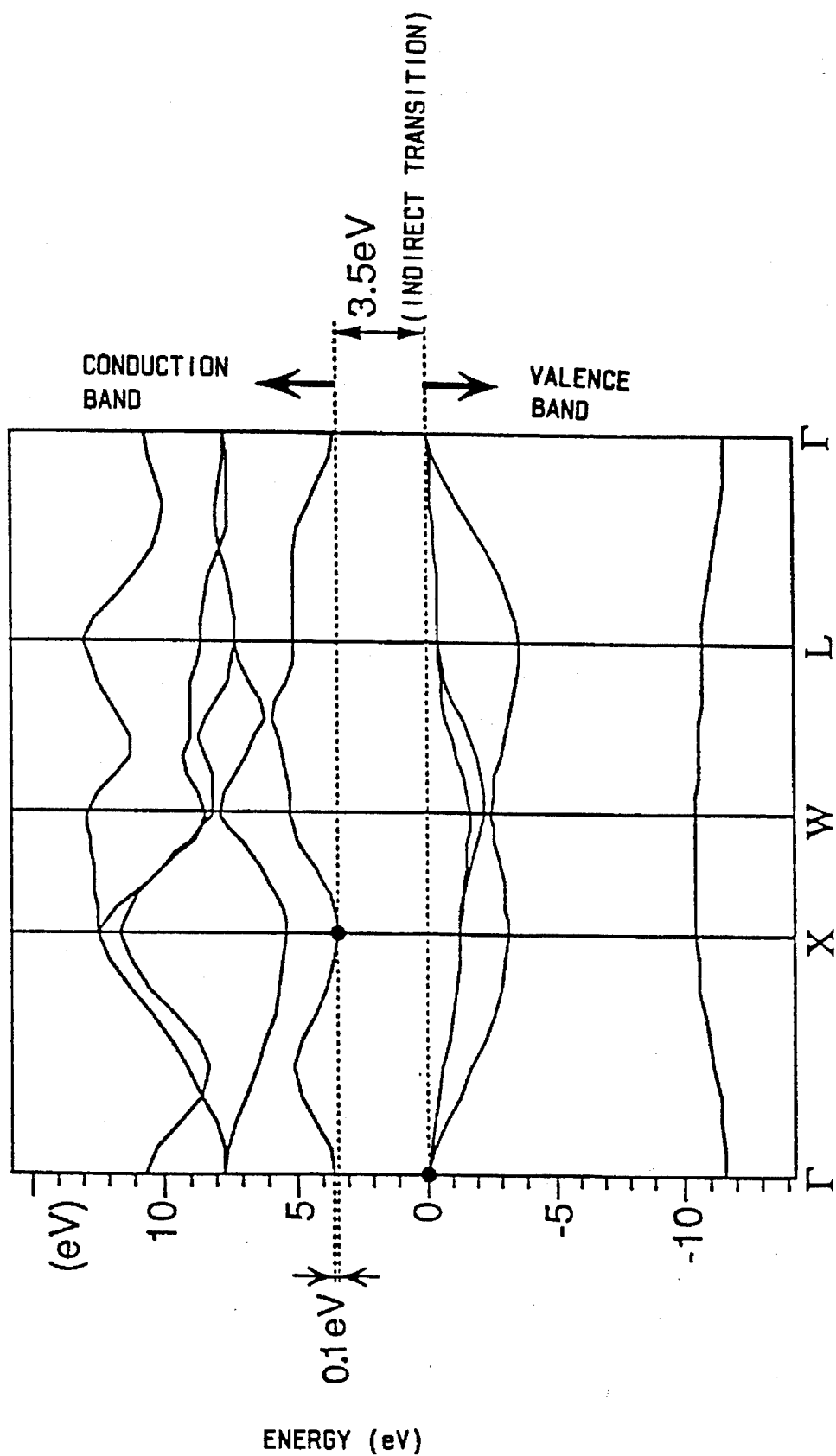
FIG. 1 is a schematic view showing the calculated energy band structure of MgS with a zincblende crystal structure.
Figure 2:
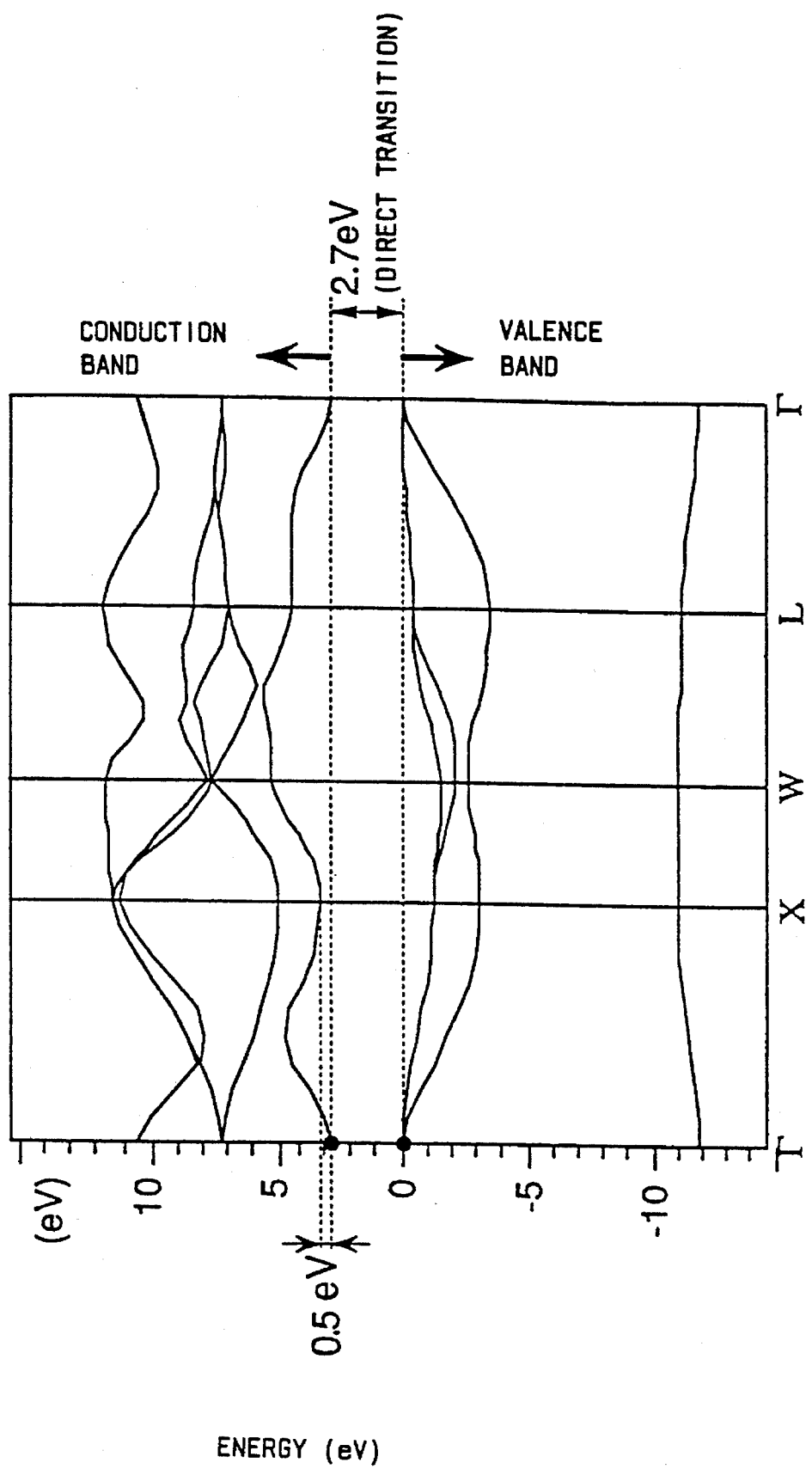
FIG. 2 is a schematic view showing the calculated energy band structure of MgSe with a zincblende crystal structure.

Next calculation was made for energy band structures of MgS and MgSe with zincblende crystal structures whose lattice constants are 5.48 Å and 5.82 Å, respectively, and resulted as shown in FIGS. 1 and 2. It is noted from FIGS. 1 and 2 that energy band structures of MgS and MgSe with zincblende crystal structures are indirect-transitional and direct-transitional, respectively. The bottom of the conduction band of MgS with the zincblende crystal structure is located at the X-point (see FIG. 1). Band gaps of MgS and MgSe with the zincblende crystal structures are 3.5 eV and 2.7 eV, respectively.

These values of band gaps are smaller than those reported before by the present Applicant (Jpn. J. Appl. Phys., 30(1991)1620). This is because pseudo-potential calculation, in general, provides smaller band gaps than actual band gaps. In this respect, there is a known method for correcting values of band gaps obtained by such calculation (Phys. Rev.

Figure 3:
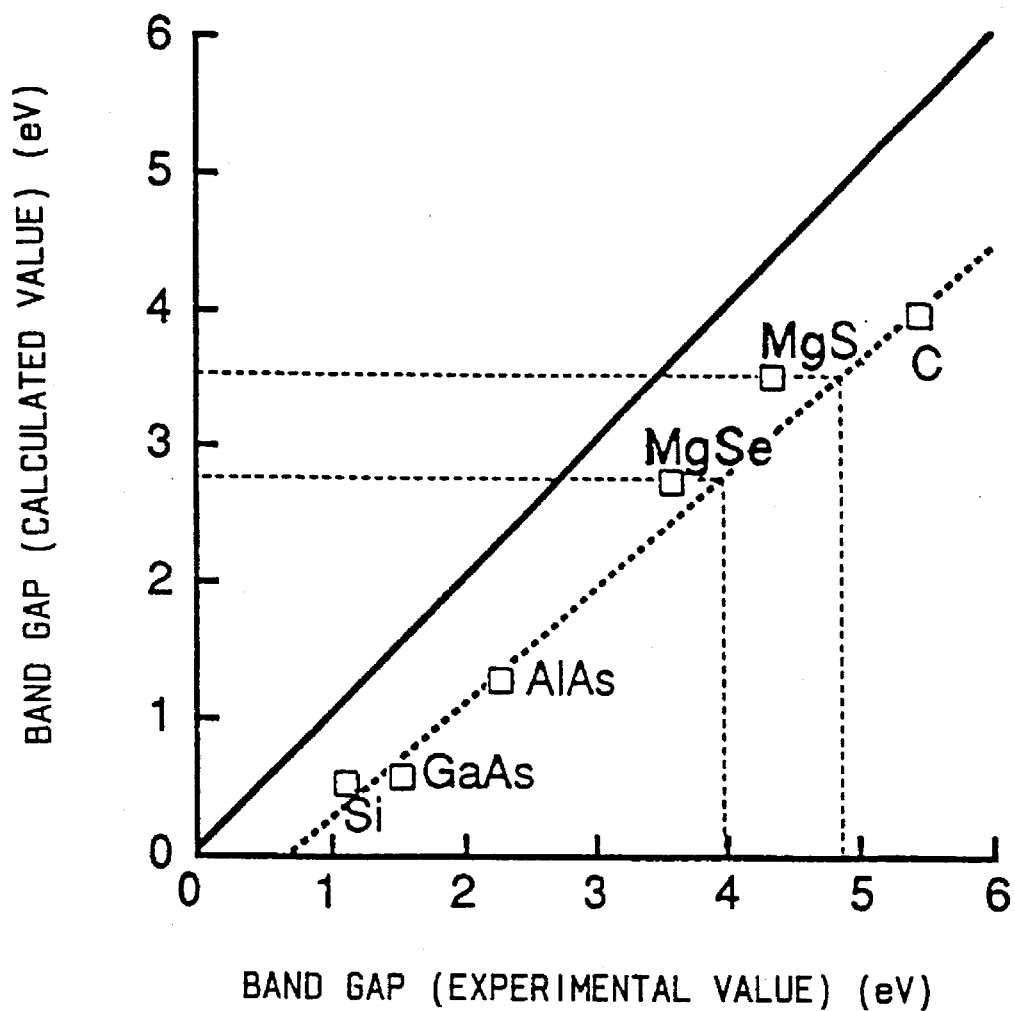
FIG. 3 is a graph for explaining a method for correcting values of band gaps obtained by a calculation.

B., 17(1988)10159). This method of correction was used to obtain actual values, in the manner shown in FIG. 3, from values of band gaps, 3.5 eV and 2.7 eV, obtained by calculation regarding MgS and MgSe with zincblende crystal structures. Actual values thus obtained were 4.8 eV and 4.0 eV, respectively. Predicted band gaps of MgS and MgSe with zincblende crystal structures at 77 K are 4.5 eV and 3.6 eV, respectively.

Figure 4:
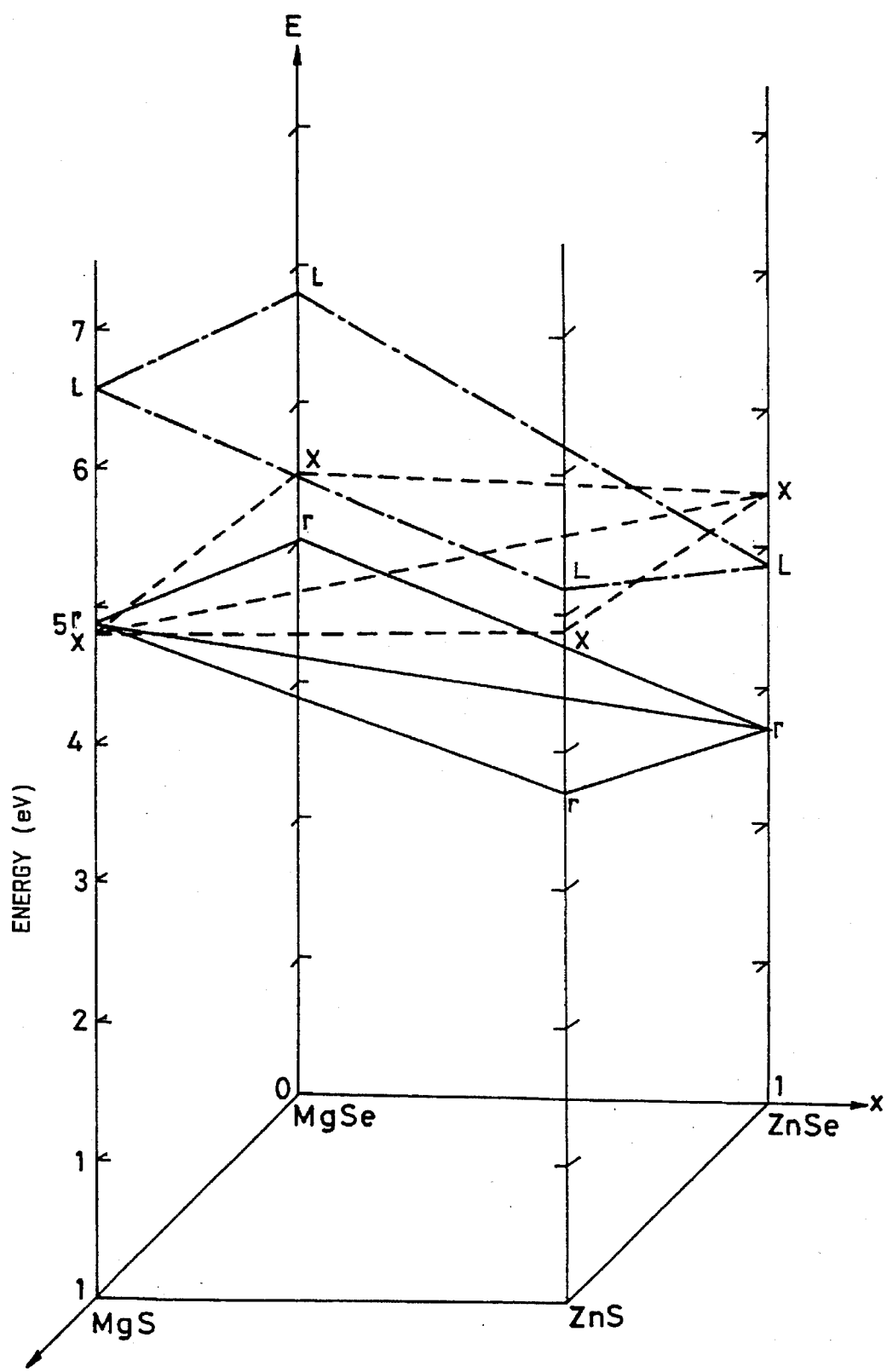
FIG. 4 is a schematic view for explaining a range of composition for a $Zn_xMg_{1-x}S_ySe_{1-y}$ compound semiconductor to have a direct-transitional energy band structure.

FIG. 4 shows relations between compositions and band gaps of $Zn_xMg_{1-x}S_ySe_{1-y}$ compound semiconductors. In FIG. 4, energies of ZnSe at the Γ-point, X-point and L-point are 2.7 eV, 4.4 eV and 3.9 eV, respectively, at 0 K, those of ZnS at the Γ-point, X-point and L-point are 3.7 eV, 4.9 eV and 5.2 eV, respectively, at 0 K, those of MgSe at the Γ-point, X-point and L-point are 4.0 eV, 4.5 eV and 5.8 eV, respectively, at 0 K, and those of MgS at the the Γ-point, X-point and L-point are 4.9 eV, 4.8 eV and 6.6 eV, respectively, at 0 K.

Figure 5:
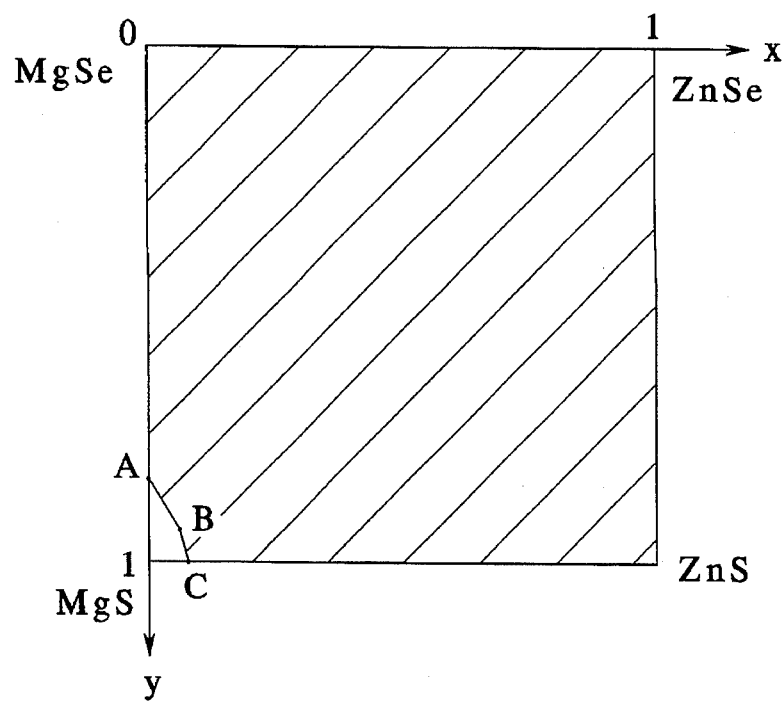
FIG. 5 is a schematic view for explaining a range of composition for a $Zn_xMg_{1-x}S_ySe_{1-y}$ compound semiconductor to have a direct-transitional energy band structure.

With reference to FIG. 4, $Zn_xMg_{1-x}S_ySe_{1-y}$ compound semiconductors have direct-transitional energy band structures when having such compositions that the surface including Γ-points of ZnSe, znS, MgS and MgSe with zincblende crystal structures comes below the surface including their X-points. From FIG. 4, composition of $Zn_xMg_{1-x}S_ySe_{1-y}$ compound semiconductors with direct-transitional energy band structures ranges in $0 \leq x < 1$ and $0 \leq y \leq 1$ excluding ranges of $1.2y-2.2x \geq 1$, $1.3y-3.9x \geq 1$, $x \geq 0$, and $y \leq 1$. The range of composition of $Zn_xMg_{1-x}S_ySe_{1-y}$ compound semiconductors with direct-transitional energy band structures can be shown as a range in the x-y plane as shown in FIG. 5 in which it is shown by hatching. In FIG. 5, coordinates of the A-point is (0, 0.83), those of the B-point is (0.06, 0.94) and those of the C-point is (0.08, 1).

Figure 6:
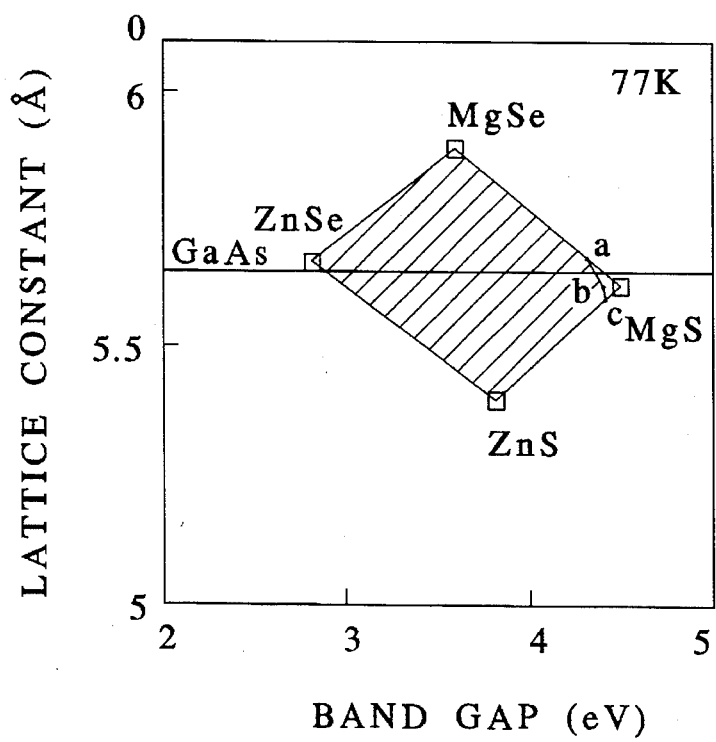
FIG. 6 is a graph showing relations between lattice constants and band gaps of ZnSe, ZnS, MgS and MgSe having zincblende crystal structures at 77 K.

These relations between lattice constants and band gaps of ZnSe, ZnS, MgS and MgSe with zincblende crystal structures at 77 K are shown by the hatched area in FIG. 6. In FIG. 6, the a-point divides the straight line from the MgSe-point to the MgS-point into about 5:1, the b-point divides the straight line from the ZnSe-point to the MgS-point into about 17:1, and the c-point divides the straight line from the ZnSpoint to the MgS-point into about 12:1.

The embodiment of the invention uses such a $Zn_xMg_{1-x}S_ySe_{1-y}$ compound semiconductor of a composition with a direct-transitional energy band structure as the material of the active layer of the semiconductor laser.

Figure 7:
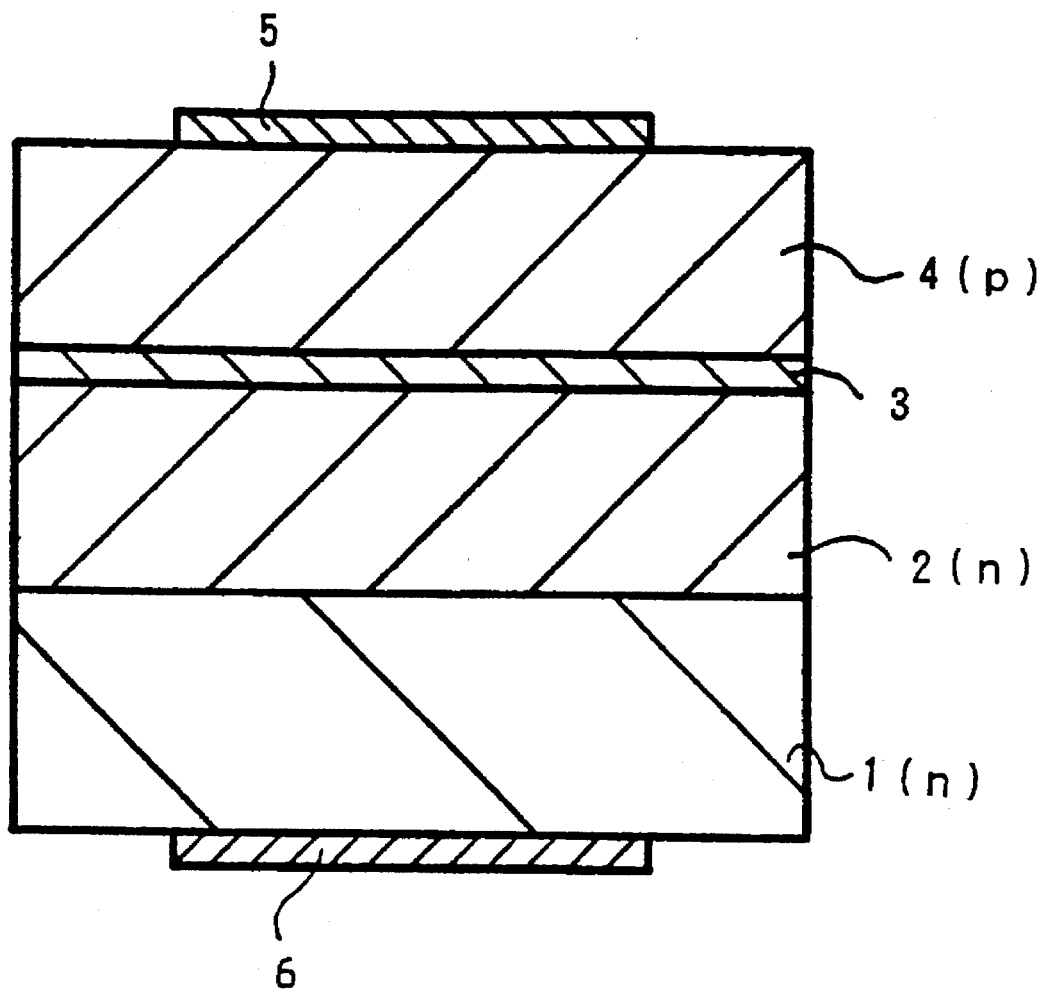
FIG. 7 is a cross-sectional view showing a semiconductor laser according to an embodiment of the invention.

That is, in the semiconductor laser according to the embodiment of the invention, as shown in FIG. 7, an n-type semiconductor substrate 1 is used, on which an n-type cladding layer 2, a $Zn_xMg_{1-x}S_ySe_{1-y}$ active layer 3 where $0 \leq x \leq 1$ and $0 \leq y \leq 1$ excluding ranges of $1.2y-2.2x \geq 1$, $1.3y-3.9x \geq 1$, $x \geq 0$, and $y \leq 1$, and a p-type cladding layer 4 are stacked in sequence so as to form a laser cavity of a so-called DH structure (double heterostructure) in which the $Zn_xMg_{1-x}S_ySe_{1-y}$ active layer 3 is sandwiched by the n-type cladding layer 2 and the p-type cladding layer 4 from opposite sides. Further stacked on the p-type cladding layer 4 is a p-side electrode 5, and an n-side electrode 6 is made on the rear surface of the n-type semiconductor substrate 1.

In this case, the n-type cladding layer 2 and the p-type cladding layer 4 are made of $Zn_xMg_{1-x}S_ySe_{1-y}$ compound semiconductors of a composition providing an appropriate difference in band gaps, i.e. about 0.3 eV or more, between the n-type cladding layer 2 and the p-type cladding layer 4, and the $Zn_xMg_{1-x}S_ySe_{1-y}$ active layer 3.

Exemplary compositions of the $Zn_xMg_{1-x}S_ySe_{1-y}$ active layer 3, n-type cladding layer 2 and p-type cladding layer 4 are as follows.

In a first example, when the composition of the $Zn_xMg_{1-x}S_ySe_{1-y}$ active layer 3 is x=0.2 and y=0.6, the n-type cladding layer 2 and the p-type cladding layer 4 are made of a $Zn_xMg_{1-x}S_ySe_{1-y}$ compound semiconductor where x=0 and y=0.9. The band gap of the $Zn_xMg_{1-x}S_ySe_{1-y}$ active layer 3 and the band gap of the n-type cladding layer 2 and the p-type cladding layer 4 are 4.0 eV and 4.3 eV, respectively, at 0 K. In this case, the lasing wavelength is about 310 nm.

In a second example, when the composition of the $Zn_xMg_{1-x}S_ySe_{1-y}$ active layer 3 is x=0.3 and y=0.7, the n-type cladding layer 2 and the p-type cladding layer 4 are made of a $Zn_xMg_{1-x}S_ySe_{1-y}$ compound semiconductor where x=0 and y=1. The band gap of the $Zn_xMg_{1-x}S_ySe_{1-y}$ active layer 3 and the band gap of the n-type cladding layer 2 and the p-type cladding layer 4 are 4.3 eV and 4.8 eV, respectively, at 0 K. In this case, the lasing wavelength is about 290 nm.

In a third example, when the composition of the $Zn_xMg_{1-x}S_ySe_{1-y}$ active layer 3 is x=0.4 and y=0.8, the n-type cladding layer 2 and the p-type cladding layer 4 are made of a $Zn_xMg_{1-x}S_ySe_{1-y}$ compound semiconductor where x=0.1 and y=1. The band gap of the $Zn_xMg_{1-x}S_ySe_{1-y}$ active layer 3 and the band gap of the n-type cladding layer 2 and the p-type cladding layer 4 are 4.0 eV and 4.3 eV, respectively, at 0 K. In this case, the lasing wavelength is about 310 nm.

The n-type semiconductor substrate 1 used in the embodiment is, for example, an n-type GaAs substrate, in substantial lattice matching with the $Zn_xMg_{1-x}S_ySe_{1-y}$ active layer 3 used.

As referred to above, since the semiconductor laser according to the embodiment uses the $Zn_x Mg_{1-x}S_ySe_{1-y}$ active layer 3 with a direct-transitional energy band structure of $0 \leq x < 1$ and $0 \leq y \leq 1$ excluding ranges of $1.2y-2.2x \geq 1$, $1.3y-3.9x \geq 1$, $x \geq 0$, and $y \leq 1$, and having a band gap in the range from 2.7 to 4.6 eV at 0K, the lasing wavelength ranges from 460 nm to 270 nm, which falls in blue to ultraviolet spectra. That is, the embodiment realizes a semiconductor laser capable of emitting blue to ultraviolet light.

Furthermore, the embodiment can use a variety of materials, not limited to GaAs, as the material of the n-type semiconductor substrate 1, as understood also from FIG. 6. This extends the variety in designing semiconductor lasers.

Having described a specific preferred embodiment of the present invention with reference to the accompanying drawings, it is to be understood that the invention is not limited to that precise embodiment, and that various changes and modifications may be effected therein by one skilled in the art without departing from the scope or the spirit of the invention as defined in the appended claims.

For example, although the semiconductor laser according to the embodiment has been described as having a DH structure, the invention can be applied to a semiconductor laser having a so-called SCH structure (separate confinement heterostructure) in which optical waveguide layers are provided between the $Zn_xMg_{1-x}S_y Se_{1-y}$ active layer 3 and the n-type cladding layer 2 and between the $Zn_xMg_{1-x}S_ySe_{1-y}$ active layer 3 and the p-type cladding layer 4 to reinforce confinement of light.

As explained above, according to the invention, since the active layer of the semiconductor laser is made of a $Zn_xMg_{1-x}S_ySe_{1-y}$ compound semiconductor where $0 \leq x < 1$ and $0 \leq y \leq 1$ excluding ranges of $1.2y-2.2x \geq 1$, $1.3y-3.9x \geq 1$, $x \geq 0$, and $y \leq 1$, semiconductor lasers capable of emitting blue to ultraviolet light can be realized.

What is claimed is:

1. A semiconductor laser configured to sandwich an active layer by an n-type cladding layer and a p-type cladding layer from opposite sides, wherein said active layer is made of a $Zn_xMg_{1-x}S_ySe_{1-y}$ compound semiconductor where $0 \leq x < 1$ and $0 \leq y \leq 1$ excluding ranges of $1.2y - 2.2x \geq 1$, $1.3y - 3.9x \geq 1$, $x \geq 0$, and $y \leq 1$.

2. The semiconductor laser according to claim 1 wherein the band gap of said $Zn_xMg_{1-x}S_ySe_{1-y}$ compound semiconductor ranges from 2.7 eV to 4.6 eV at the absolute zero.

3. The semiconductor laser according to claim 1 wherein said n-type cladding layer and said p-type cladding layer are made of $Zn_xMg_{1-x}S_ySe_{1-y}$ compound semiconductors of a composition providing a band-gap difference of 0.3 eV or more between said n-type cladding layer and said p-type cladding layer, and said active layer.

4. The semiconductor laser according to claim 1 wherein a substrate material is GaAs.

* * * * *